(12) United States Patent
Cowles (10) Patent No.: US 6,535,439 B2
(45) Date of Patent: Mar. 18, 2003

(54) FULL STRESS OPEN DIGIT LINE MEMORY DEVICE

(75) Inventor: Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/850,792

(22) Filed: May 8, 2001

(65) Prior Publication Data

US 2002/0167852 A1 Nov. 14, 2002

(51) Int. Cl.[7] .................................................. G11C 7/00
(52) U.S. Cl. ...................................... 365/201; 365/200
(58) Field of Search ................................ 365/200, 205, 365/201

(56) References Cited

U.S. PATENT DOCUMENTS 4,654,849 A * 3/1987 White, Jr. et al. ............ 371/21
6,222,752 B1 * 4/2001 Kumar et al. ................. 365/49

* cited by examiner

Primary Examiner—M. Tran
(74) Attorney, Agent, or Firm—Schwegman, Lundberg, Woessner & Kluth, P.A.

(57) ABSTRACT

An open digit line memory device includes a memory array. The memory array includes a plurality of memory cells. The memory cells are grouped into sub-arrays. Each of the sub-arrays includes a plurality of digit lines. The digit lines from adjacent sub-arrays connect to a plurality of sense amplifiers. The sense amplifiers located next to the edges of the memory array connect to dummy digit lines. The dummy digit lines are connected to a fixed voltage during a normal mode. During a test mode, the fixed voltage is replaced by a variable voltage so that the all of the sub-arrays, including the sub-arrays at the edges, can be equally stressed during the test mode.

54 Claims, 9 Drawing Sheets

FULL STRESS OPEN DIGIT LINE MEMORY DEVICE

TECHNICAL FIELD OF THE INVENTION

The present invention relates generally to integrated circuit memory devices, and in particular to a memory device having open digit line architecture.

BACKGROUND OF THE INVENTION

A memory device such as a dynamic random access memory (DRAM) device typically comprises a number of memory cells arranged in rows and columns. The memory cells are grouped into sub-arrays. Each memory cell includes a capacitor capable of holding a charge and an access transistor for accessing the capacitor charge. The charge is referred to as a data bit and can be either a high voltage or a low voltage. Data can be either stored in the memory cells during a write mode, or data may be retrieved from the memory cells during a read mode. The access transistors of the memory cells connect to internal signal lines, referred to as bit or digit lines. The digit lines connect to input/output lines through input/output transistors, which are used as switching devices to allow data to be transmitted between the digit lines and the input/output lines during a read or write mode.

A number of sense amplifiers are included in the memories to both sense data stored in the memory cells and amplify the data for outputting. Each sense amplifier compares a charge stored on a memory cell with a known reference. A sense amplifier typically connects to two digit lines to perform the sensing operation. In the sensing operation, the two digit lines are first equalized to a reference voltage which is typically, but not limited to, one half of the supply voltage (Vcc). After that, the digit lines are driven to opposite voltage levels. That is, one of the digit lines is driven to Vcc and the other is driven to ground. The voltage on the digit line connected to the memory cell being accessed indicates the value of data stored in the memory cell.

In a memory device having an open digit line architecture, the sense amplifiers are located between the sub-arrays. Each sense amplifier connects to two digit lines, which connect to memory cells from two adjacent sub-arrays. However, the sense amplifiers located at the sub-array at the edge of the memory array (edge sense amplifiers), only connect to memory cells from the edge sub-array on one side. The other digit line does not connect to any memory cells because there is no sub-array on the other side of the edge sense amplifiers. Thus, edge sense amplifiers are not used. These are just dummy sense amplifiers. The memory cells connected to the edge sense amplifiers are, therefore, dummy memory cells. The digit lines connected to the dummy sense amplifiers are dummy memory cells. In the conventional memory device having an open digit line architecture, the dummy digit lines always connect to a fixed voltage, typically Vcc/2.

In the open digit line memory device, all digit lines are interleaved. That is one digit line of a sub-array connects to one sense amplifier on one side of the sub-array, and an adjacent digit line connects to another sense amplifier on the other side of the sub-array. Therefore, the edge sub-array has dummy digit lines being interleaved with the normal digit lines. That is every dummy digit line is adjacent to two normal digit lines and every normal digit line is adjacent to two dummy digit lines.

A problem arises when a stress test is applied to the sub-arrays of memory cells of the traditional open digit architecture memory device. During the test, a test pattern is applied to the memory cells. The test pattern may be set to include random data, which is represented by different voltages such as Vcc and ground. For example, opposite voltages of Vcc and ground can be written to two adjacent memory cells. Writing a test pattern of Vcc and ground to the memory cells during the test is similar to writing data having logic "1" and logic "0" to the memory cells during a normal memory operation. This way, the digit lines connected to the memory cells can be driven to the opposite voltages of Vcc and ground to stress for any defect between the digit lines or between the memory cells.

However, because the dummy memory cells of the traditional open digit line memory device always connect to Vcc/2, the voltages between a normal digit line and an adjacent dummy digit line can only be Vcc and Vcc/2 or ground and Vcc/2. This means that the memory cells or digit lines of the edge sub-arrays only get half the stress of that of the memory cells or digit lines of the non-edge sub-arrays. Therefore, in the traditional open digit line memory device, the test may not detect a defect that occurs at the edge sub-arrays when the same defect could have been detected had it occurred at the non-edge sub-arrays.

For the reasons stated above, and for other reasons stated below which will become apparent to those skilled in the art upon reading and understanding the present specification, there is a need in the art for an improved open digit line memory device in which memory cells including the memory cells of the edge sub-arrays can be equally tested.

SUMMARY OF THE INVENTION

The present invention includes a memory device having a plurality of sub-arrays of memory cells connected to a plurality of digit lines. A portion of the digit lines are dummy digit lines, which always connect to a fixed voltage during a normal mode. However, according to the teaching of the invention, during a test, the fixed voltage is replaced by a variable voltage so that the all of the sub-arrays can be equally stressed during the test.

In one aspect, the memory device includes a plurality of normal memory cells and dummy memory cells. The normal memory cells connect to normal digit lines. The dummy memory cells connect to dummy digit lines. The dummy digit lines always connect to a fixed voltage during a normal mode. The memory device further includes a voltage controller. The voltage controller replaces the fixed voltage with a variable voltage during a test.

In another aspect, a method of testing a memory device is provided. The method includes activating a test mode signal during a test. The method also includes disconnecting a fixed voltage connected to a voltage bus. The voltage bus connects to a plurality of dummy digit lines of a sub-array of memory cells. The sub-array is located at an edge of a memory array of the memory device. The method further includes applying a variable voltage to the voltage bus during the test.

DETAILED DESCRIPTION OF THE INVENTION

The following detailed description refers to the accompanying drawings which form a part hereof, and which is shown, by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
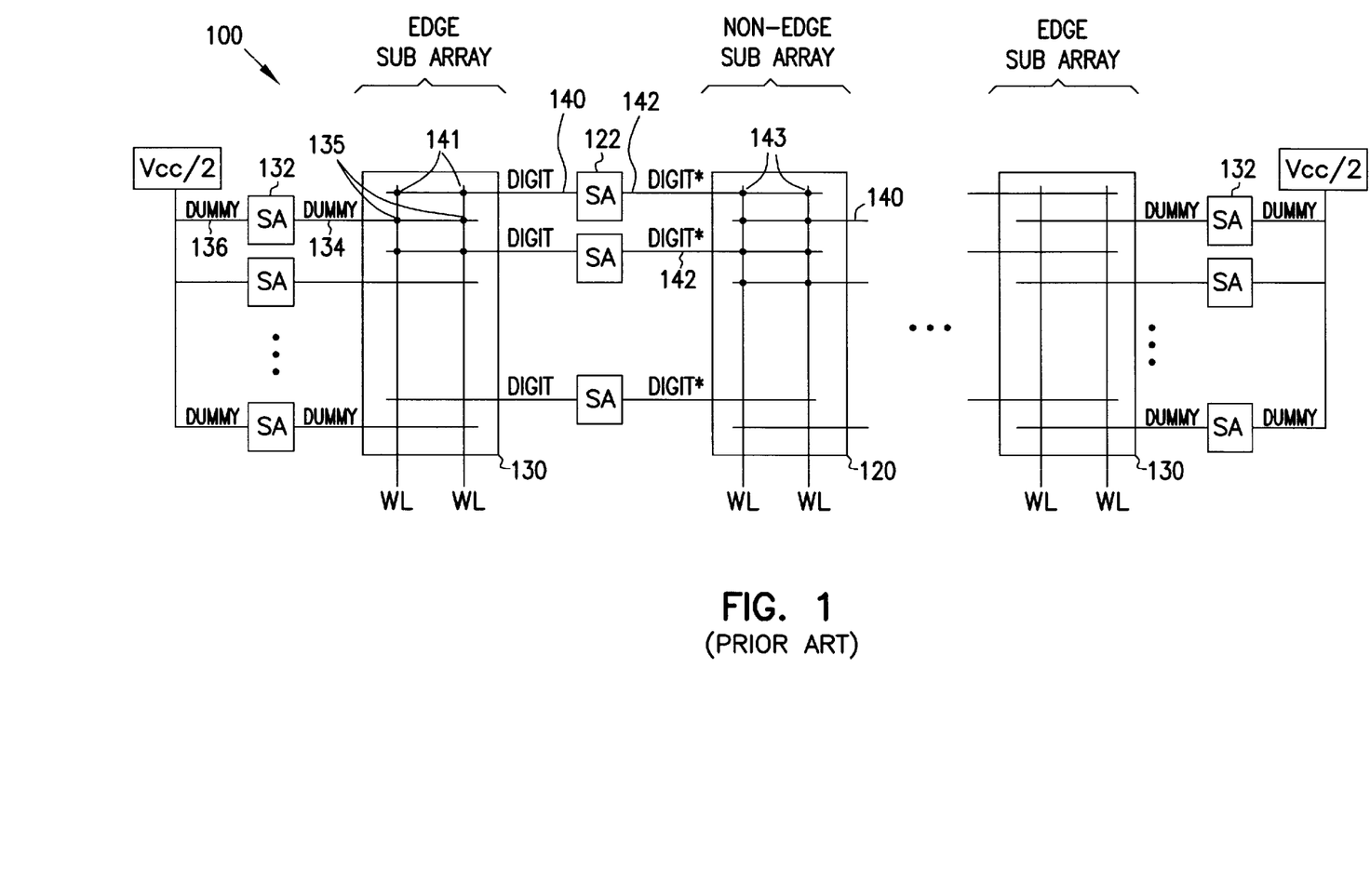
FIG. 1 is a prior art diagram of a memory array having open digit line architecture.

FIG. 1 is a diagram of a prior art memory array 100. Memory array 100 includes a plurality of non-edge sub-arrays 120 and edge sub-arrays 130. A plurality of non-edge sense amplifiers (SA) 122 and edge sense amplifiers 132 are included. Memory array 100 is an open digit line architecture. A memory cell is located at each row and column intersection. Moreover, the memory cells in the same column connect to the same digit line, DIGIT or DIGIT*. The memory cells in the same row connect to the same row line or word line, WL. That is, the digit lines are interleaved, such that an activated word line WL will access a memory cell on each digit line.

Each of the non-edge sense amplifiers 122 connects to a first digit line 140, e.g., DIGIT, on one side and a second digit line 142, e.g., DIGIT* on the opposite side. Digit lines 140 and 142 are commonly referred to as complimentary digit lines. First digit line 140 connects to a plurality of memory cells 141, indicated by dots at each intersection of a digit line and a world line, WL, in sub-array 130. Second digit line 142 also connects to a plurality of memory cells 143 in sub-array 120 which are similar to those in sub-array 130. Memory cells 141 and 143 are normal memory cells. Digit lines 140 and 142 are normal digit lines. The normal digit lines are those that are used by the memory device for performing sensing operation and for transmitting data to and from the memory cells. The normal digit lines 140 and 142 of the same non-edge sub-array 120 are interleaved as shown in FIG. 1.

Each of the edge sense amplifiers 132 connects to a first (edge) digit line 134 on one side of the sense amplifier and a second digit line 136 on the opposite side of the sense amplifier. First digit line 134 connects to a plurality of memory cells 135. Second digit line 136 on the other side of the sense amplifier does not connect to any memory cells because there is no sub-array on the other side of sense amplifier 132. Edge sense amplifier 132 is not useful for performing sensing operation and memory cells 135 connected to sense amplifier 132 are unused. Hence, sense amplifiers 132 are dummy sense amplifiers; memory cells 135 are dummy memory cells; digit lines 134 and 136 are dummy digit lines. In the conventional open digit line memory architecture, dummy digit line 136 always connects to a fixed voltage, which is typically Vcc/2 or one half of the supply voltage. Similar to normal digit lines of non-edge sub-array 120, dummy digit line 134 and normal digit line 140 of edge sub-array 130 are also interleaved.

Figure 2:
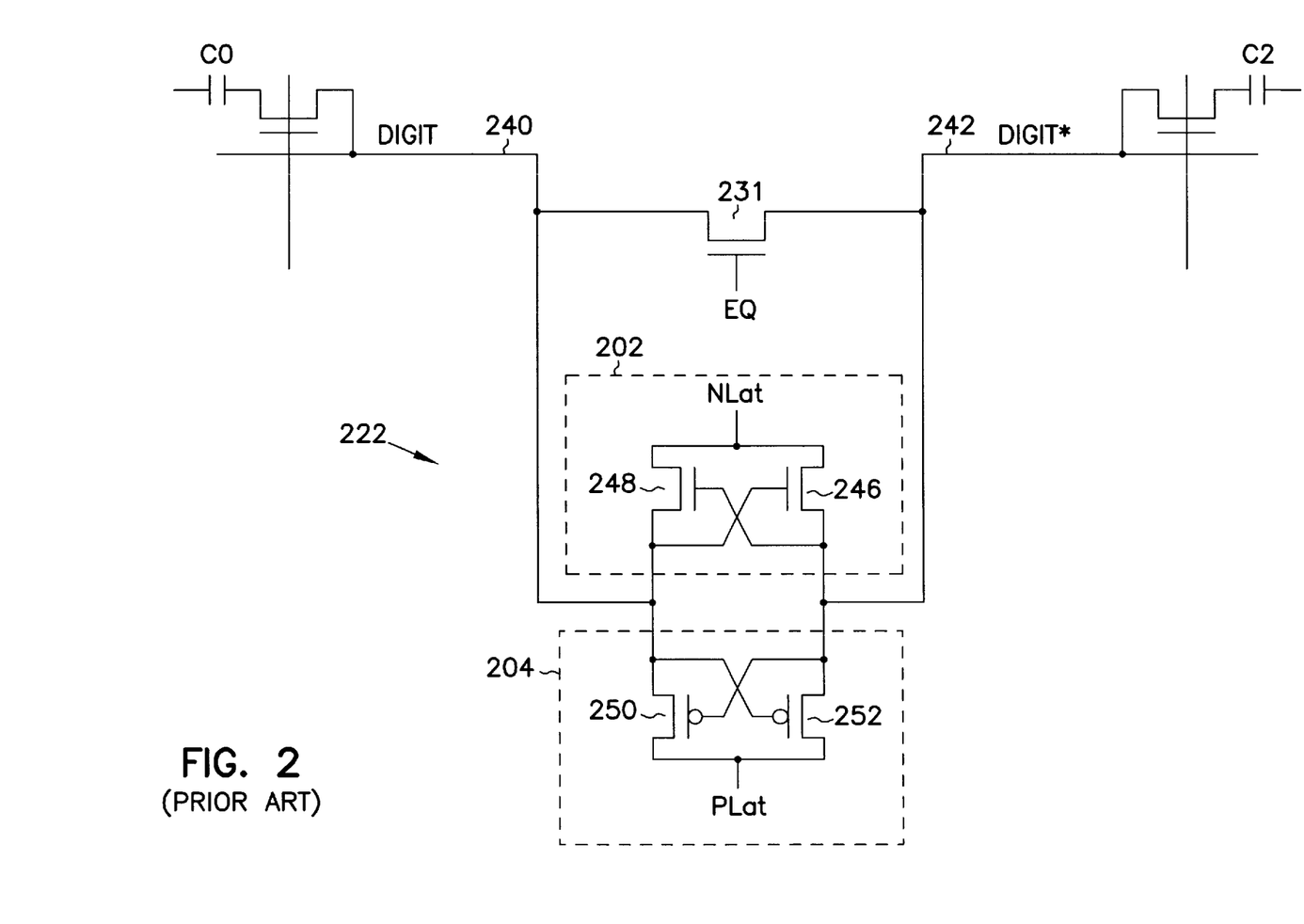
FIG. 2 is a prior art schematic diagram of a sense amplifier connected to digit lines of the memory array of FIG. 1.

FIG. 2 is a prior art schematic diagram of non-edge sense amplifier 222, similar to that shown as 122 in FIG. 1, connected to digit lines 240 and 242. Non-edge sense amplifier 222 includes an n-sense circuit 202 and a p-sense circuit 204. As known to one skilled in the art, n-sense and p-sense circuits 202 and 204 sense a differential between digit lines 240 and 242 and drive them to full rails, i.e., to supply voltage and ground. N-sense circuit 202 has two n-channel transistors 248 and 246 having their gates cross-coupled to the source of the other transistor. The drains of transistors 246 and 248 connect together and are controlled by an NLat line. The NLat line is typically pre-charged to the same level that lines 240 and 242 have been equalized to, which is Vcc/2. Similarly, p-sense circuit 204 has two cross-coupled p-channel transistors 250 and 252. The drains of transistors 250 and 252 connect together and are controlled by a PLat line. The PLat line is typically pre-charged to the same level that nodes 240 and 242 have been equalized to, which is Vcc/2.

The memory cells connected to digit lines 240 or 242 can be accessed by these steps. The first step is to equilibrate lines 240 and 242 to Vcc/2, as generated by a biasing circuit (not shown), by holding the gate of transistor 231 (EQ) high. The differential voltage across the sense amps is therefore zero with each of digit lines 240 and 242 having a preferred voltage of Vcc/2. Next, one of the memory cells, C0 or C2, is accessed. The charge, or lack of charge, stored on the selected memory cell is then shared with one of the digit lines 240 and 242. If a logical "one" is stored on the selected memory cell, the associated digit line will be slightly raised, for example by a voltage of approximately 20 millivolts. If a logic "zero" is stored in the selected memory cell, the digit line voltage will drop, for example by 20 millivolts. It will be understood that the charge shared with the digit line is directly dependent upon the charge stored on the memory cell.

Next, the voltage on the NLat line is lowered to sense a high voltage on one of the lines 240 and 242. Assuming, for example, that line 240 is 20 millivolts above line 242, transistor 246 will begin to turn on when the NLat drops by a threshold voltage below node 240. Node 242 will then be pulled to NLat to insure that transistor 248 does not turn on. Next, The voltage on the PLat line is raised to sense a low voltage on one of the lines 240 and 242. Assuming for example that node 242 is 20 millivolts below node 240, transistor 250 will begin to turn on when the PLat increases by a threshold voltage above node 242. Node 240 will then be pulled to PLat to insure that transistor 252 does not turn on. The NLat and PLat are strobed to full power rails, i.e., ground and Vcc, respectively. If one of the digit lines 240 and 242 is higher, therefore, that digit line will be driven to Vcc while the complementary digit line is pulled to ground. In summary, non-edge sense amplifiers drive the first and second digit lines to Vcc and ground after a memory cell connected to one of the digit lines is accessed.

The description of non-edge sense amplifier 222 in FIG. 2 shows that normal digit lines such as digit lines 240 and 242 can be driven to opposite voltages of Vcc and ground after the sensing operation. Thus, adjacent normal digit lines of any non-edge sub-array 220 can be driven to Vcc and ground by the same sensing operation as described in FIG. 2. From this explanation, one of ordinary skill in the art will appreciate that in the edge sub-array, shown as 130 in FIG. 1, only normal digit line 141 can be driven to Vcc or ground by non-edge sense amplifier 122. The adjacent digit line, e.g., dummy digit line 134 in FIG. 1, is always held at Vcc/2. In other words, normal digit line 140 and dummy digit line 134 cannot be driven to opposite voltages of Vcc and ground. For this reason, the normal digit lines and normal memory cells of edge sub-array 130 do not get the same stress as that of the normal digit lines and normal memory cells of non-edge sub-array 120. This prohibits accurate testing of all sub-arrays of the memory device.

Figure 3:
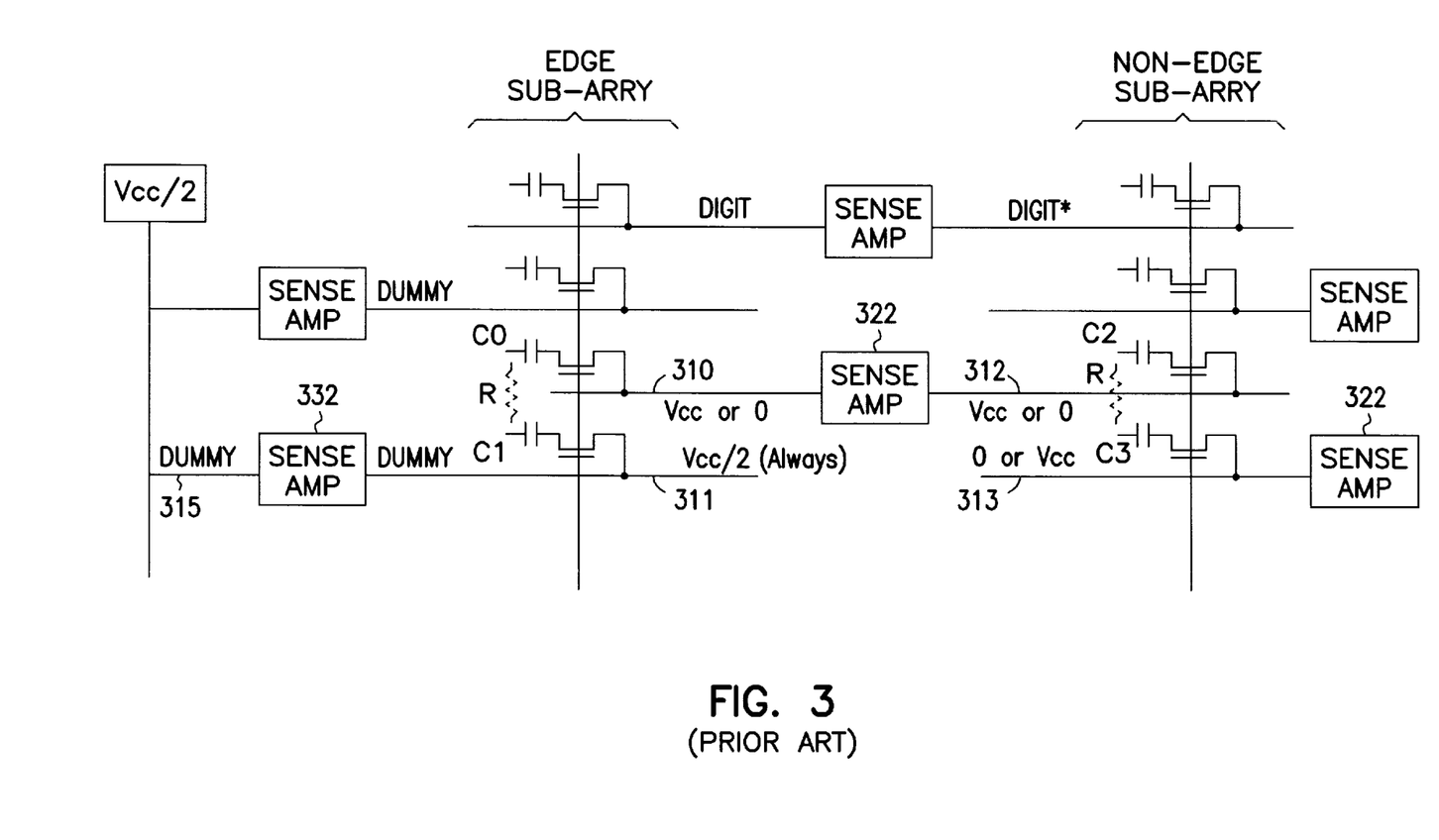
FIG. 3 shows in more detail a portion of the memory array of FIG. 1.

FIG. 3 shows in more detail a portion of memory array 100 of FIG. 1 including edge sub-array portions. A plurality of normal memory cells C0, C2 and C3 and a dummy memory cell C1 are shown. Memory cells C0 and C2 connect to digit lines 310 and 312, which connect to opposite sides of sense amplifier 322. Sense amplifier 322 is similar to the non-edge sense amplifier 322 shown in FIG. 1. Memory cell C3 connects to digit line 313, which connects to another sense amplifier 322. Memory cell C1 connects to a dummy digit line 311, which connects to one side of a dummy sense amplifier 332. The other side of dummy sense amplifier 332 connects to another dummy digit line 315, which always connects to Vcc/2 in the conventional open digit line memory architecture. Dummy digit line 315 and 311 are shorted together or equilibrated by sense amplifier 332, thus, both dummy digit lines 311 and 315 always have Vcc/2 voltage. In FIG. 3, a defect between two memory cells or two digit lines is represented by a broken line resistor symbol R. The defect may be caused by various leakage paths or shorts or both between adjacent memory cells or adjacent digit lines.

In a test, memory cells C0, C2 and C3 can be written with Vcc or ground. Thus, the normal digit lines 310, 312 or 313 connected to memory cells C0, C2 and C3 can be driven to Vcc or ground by a sensing operation as described in FIG. 2. However, the dummy digit lines 311 and 315 are always held at Vcc/2. In a test of the conventional open digit line memory architecture, a defect (indicated by R) can be detected between cells C2 and C3. However, in the conventional open digit line memory architecture., the same defect may not be detected between cells C0 and C1 because cells C0 and C1 do not get the same stress or full sensing operation as that applied to cells C2 and C3. That is, digit lines 312 and 313 connected to cells C2 and C3 can be stressed in a full sensing operation with opposite voltages of Vcc and ground (Vcc or 0) being applied in the full sensing operation. In contrast, digit line 310 and dummy digit line 311 connected to cells C0 and C1 can only be stressed, in a sensing operation with Vcc and Vcc/2, or ground and Vcc/2 being applied as the voltage differential on digit lines 310 and 311 respectively. Therefore, in the traditional open digit line memory device, the test may not detect a defect that occurs between cells C0 and C1 when the same defect could have been detected had it occurred between cells C2 and C3. Thus, the digit lines or memory cells of edge sub-array in memory array 100 cannot be equally stressed. In other words, the digit lines and memory cells of the edge sub-arrays of the conventional open digit memory array do not get full stressed in a test operation and hence defects in the edge sub-array may go undetected.

Full Stress Open Digit Line Memory Device

Figure 4:
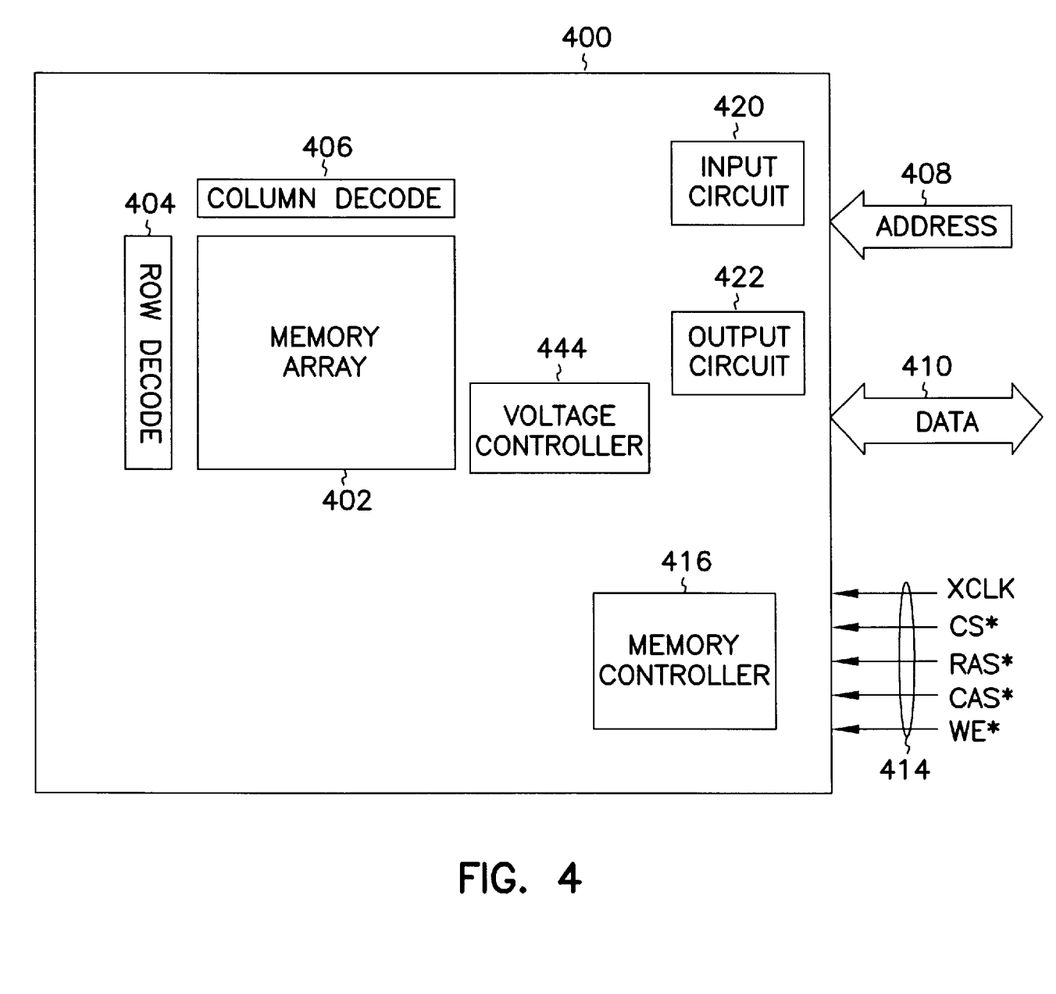
FIG. 4 is diagram of a memory device having open digit line architecture according to the invention.

FIG. 4 is diagram of memory device 400 having open digit line architecture according to the invention. Memory device 400 includes a memory array 402. In the embodiment of FIG. 4, memory array 402 includes a plurality of memory cells arranged in rows and column. Row decode circuit 404 and column decode circuit 406 access the rows and columns in response to an address, provided on a plurality of address lines or bus 408. Data is transferred to and from memory device 400 through data lines or bus 410. A memory controller 416 controls data communication to and from memory device 400, via input circuit 420 and output circuit 422 in response to input signals on control lines 414. Controller 416 receives the input signals on lines 414 to determine the modes of operation of memory device 400 such as a read, write, or test mode. The input signals on lines 414 include, but are not limited to, External Clock (XCLK), Row Access Strobe (RAS*), Column Access Strobe (CAS*), and Write Enable (WE*).

Memory device 400 also includes a voltage controller 444. During a normal mode of operation of memory device 400, voltage controller 444 provides a fixed voltage. The fixed voltage is applied to a voltage bus connected dummy digit lines. According to the teaching of the invention, during a test mode, voltage controller 444 replaces the fixed voltage with a variable voltage. The variable voltage enables all memory cells of memory array 402 to be equally stressed during the test.

Memory device 400 of FIG. 4 can be a dynamic random access memory (DRAM) or other types of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that memory device 400 of FIG. 4 is simplified to illustrate one embodiment of a memory device of the present invention and is not intended to be a detailed description of all of the features of a memory device.

Figure 5:
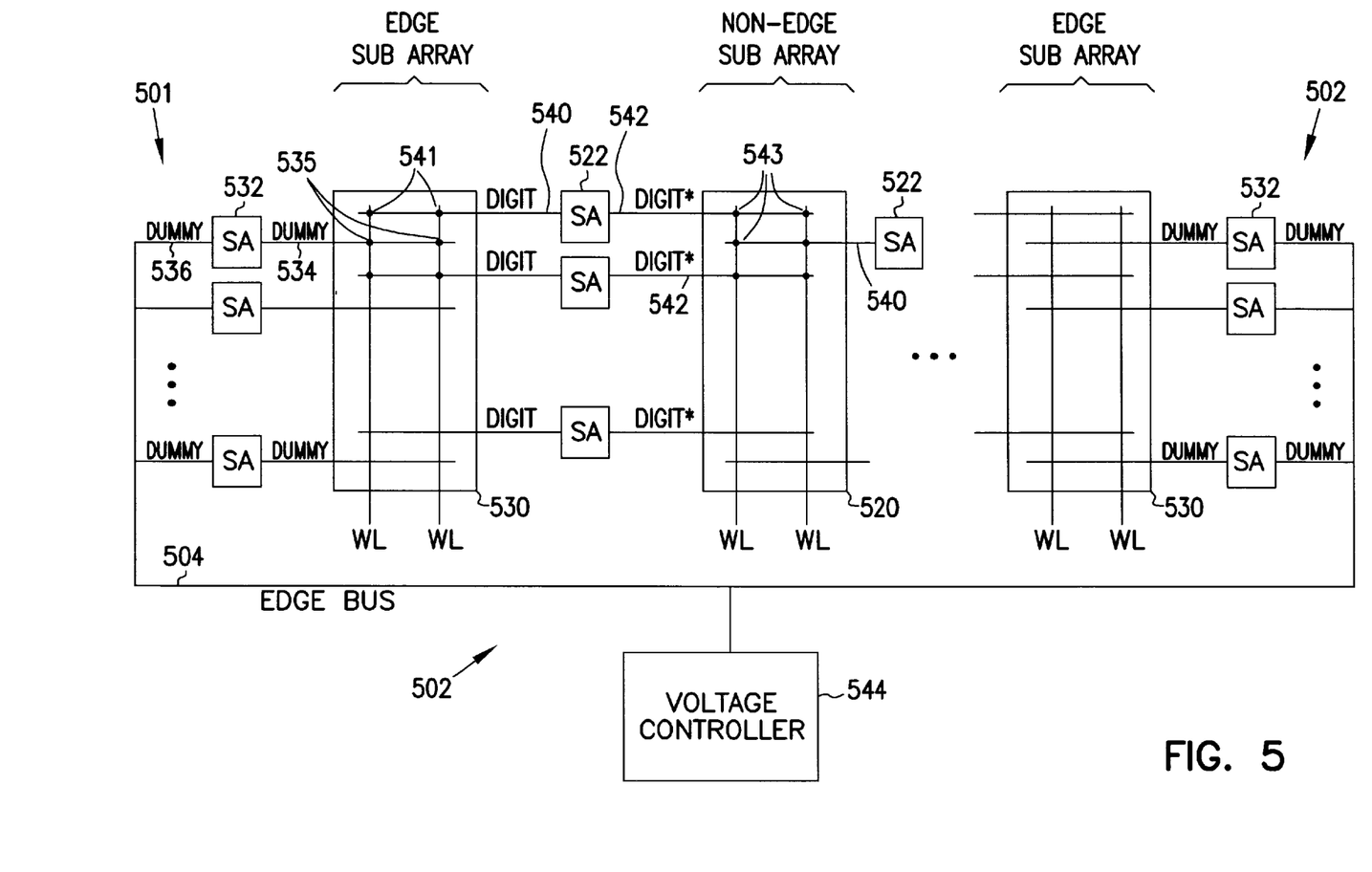
FIG. 5 is diagram showing in more detail a memory array connected to a voltage controller according to the invention.

FIG. 5 is a diagram showing in more detail a portion of the memory array connected to the voltage controller 444 of FIG. 4. As shown in FIG. 5, memory array 502 includes a plurality of non-edge sub-arrays 520 and edge sub-arrays 530. For simplicity, only one non-edge sub-array is shown in FIG. 5. Sub-arrays 520 and 530 are arranged in a row. The row runs between a first edge 501 and a second edge 502 of memory array 502. The edge sub-arrays 530 are located at the first and second edges 501 and 502. The non-edge sub-arrays 520 are located in between the edge sub-arrays 530. In the embodiment of FIG. 5, memory array 402 is shown in a simplified version to include only one row of sub-arrays, in which, only two edge sub-arrays 530 are shown. However, in other embodiments, memory array 502 includes multiple of rows of sub-arrays running in parallel with each other and in between the first and second edges 501 and 502 . In such embodiments, each row also includes two edge sub-arrays, such as edge sub-arrays 530, therefore, the number of edge sub-arrays are greater than two.

Memory array 502 includes a plurality of memory cells 541, 543 and 535, which are indicated in FIG. 5 as dots. Memory array 502 is an open digit memory array architecture. That is, a memory cell is located at each row and column intersection. Moreover, the memory cells in the same column connect to the same digit line, DIGIT or DIGIT*. The memory cells in the same row connect to the same row line or word line, WL. The digit lines are interleaved, such that an activated word line WL will access a memory cell on each digit line, e.g., DIGIT and DIGIT*.

Memory cells 541 and 543 are normal memory cells. That is, they are used in the memory array operation to store bits of data. Memory cells 535 are dummy memory cells. That is, they are not used in the memory array operation to store bits of data.

Memory array 502 also includes a plurality non-edge sense amplifiers 522 and edge sense amplifiers 532. Memory array 502 further includes a plurality of digit lines 534, 536, 540 and 542. Digit lines 540 and 542 are normal digit lines. That is, they connect normal memory cells 541 and 543 to the non-edge sense amplifiers between the sub-arrays. Digit lines 534 and 536 are dummy digit lines. That is, they connect dummy memory cells 535 to the edge sense amplifiers located on the edge of the open digit line memory array architecture.

Each of the non-edge sense amplifiers 522 connects to a first and a second normal digit lines. The first digit line includes digit line 540 provided by sub-array 530 on one side, the second digit line includes digit line 542 provided by another sub-array 520 on the opposite side. Similarly, each of the edge sense amplifiers 532 connects to first and second dummy digit lines. The first is dummy digit line 534 provided by sub-array 530 on one side. The second is dummy digit line 536, which connects the edge sense amplifier to voltage controller 544 via EDGE BUS 504. In one embodiment, first and second dummy digit lines 534 and 536 are shorted to each other. Thus, when a voltage is applied to one dummy digit line, e.g. digit line 536, the same voltage is also applied to the other dummy digit line, i.e., digit line 534. In another embodiment, first and second dummy digit lines 534 and 536 are always equilibrated by sense amplifier 532 such that they always have the same voltage. All dummy digit lines 536 connect to the EDGE BUS.

FIG. 5 illustrates an open digit line architecture in which the digit lines are interleaved. That is, two adjacent digit lines of the same sub-array connect to different sense amplifiers. For example, digit line 542 of sub-array 520 connects to one sense amplifier 522. The adjacent digit line 540 of the same sub-array 520 connects to a different sense amplifier 522. In a similar arrangement, in edge sub-array 530, dummy digit lines 534 are also interleaved with the normal digit lines 540. That is every dummy digit line 534 is adjacent to two normal digit lines 540, and every normal digit line 540 is adjacent to two dummy digit lines 534.

Figure 6:
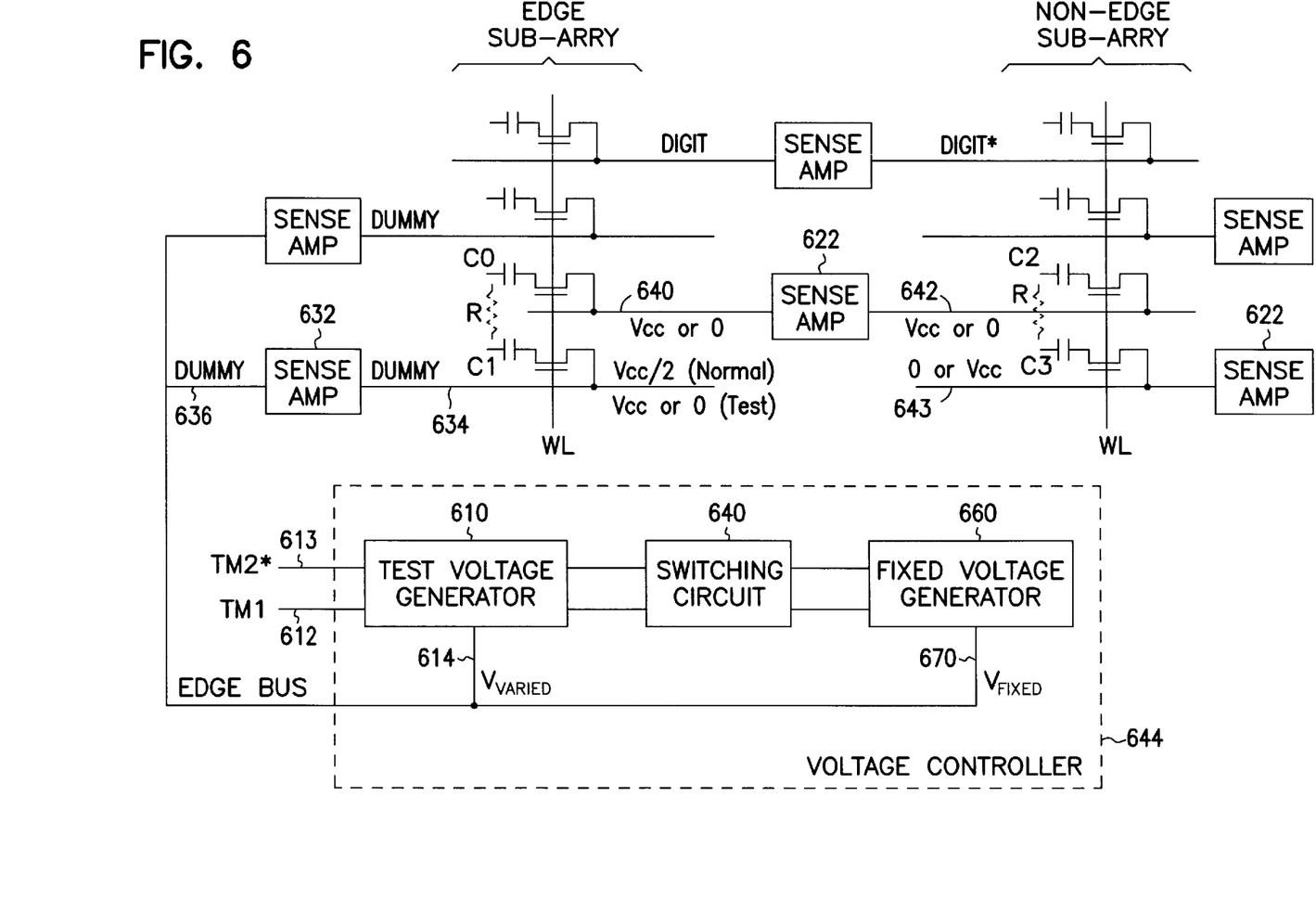
FIG. 6 is a diagram showing in more detail a portion the memory array connected to the voltage controller of FIG. 5.

FIG. 6 is a diagram showing in more detail a portion of memory array 502 and voltage controller 454 of FIG. 5. In the embodiment of FIG. 6, C0 represents normal memory cell similar to memory cells 541 in FIG. 5; C1 represents dummy memory cell similar to memory cells 535 in FIG. 5. C2 and C3 represent normal memory cells similar to memory cells 543 of FIG. 5. C0 and C1 are memory cells included in an edge sub-array. C2 and C3 are memory cells included in a non-edge sub-array. C0 and C2 connect to digit lines 640 and 642 on opposite sides of a non-edge sense amplifier 622. C3 connects to digit line 643, which connects to another non-edge sense amplifier 622. C1, however, connects to a dummy digit line 634 on one side of a dummy sense amplifier 632. The other side of sense amplifier 632 connect to another dummy digit line 636.

In one embodiment, dummy digit lines 634 and 636 are shorted to each other. Thus, when voltage is applied to dummy digit line 634, the same voltage is also applied to dummy digit line 636. In another embodiment, first and second dummy digit lines 634 and 636 are equilibrated by sense amplifier 632 such that they always have the same fixed voltage, for example Vcc/2. In FIG. 6, a possible defect between two memory cells or two digit lines is represented by a broken line resistor symbol R.

In the embodiment of FIG. 6, according to the teaching of the present invention, a voltage controller 644 is used to apply a variable voltage to digit line 638 and 634 during a testmode. Voltage controller 644 includes a test voltage generator 610, a switching circuit 640, and a fixed voltage generator 660. Test voltage generator 610 connects to the EDGE BUS via line 614 to provide a variable voltage $V_{VARIED}$. Fixed voltage generator 660 connects to the EDGE BUS via line 670 to provide a fixed voltage $V_{FIXED}$. Voltage controller 444 receives a first test signal TM1 on line 612 and a second test signal TM2* on line 613. As shown in FIG. 6, fixed voltage generator 660 is included in voltage controller 444. However, in other embodiments, fixed voltage generator 660 can be located anywhere within memory device 400 shown in FIG. 4.

During a normal mode, test voltage generator 610 is not active, thus the variable voltage $V_{VARIED}$ on line 614 is not applied to the EDGE BUS. Fixed voltage generator 660, however, is active to provide the fixed voltage $V_{FIXED}$ on line 670 to the EDGE BUS. In one embodiment of the present invention, the fixed voltage $V_{FIXED}$ provided by the fixed voltage generator 660 is Vcc/2. Vcc is a supply voltage of memory device 400. In other embodiments, the fixed voltage $V_{FIXED}$ can be a different value than Vcc/2. During the normal mode, the EDGE BUS is held at Vcc/2. Because dummy digit line 636 connects to the EDGE BUS and because dummy line 634 and 636 connect to each other, dummy digit lines 634 and 636 are also held at Vcc/2. Thus, in the embodiment of FIG. 6, dummy digit line 634 is held at a fixed voltage Vcc/2 during the normal mode.

According to the teachings of the present invention, the fixed voltage $V_{FIXED}$ is replaced by the variable voltage $V_{VARIED}$ during a test mode. In the test mode, switching circuit 640 disables fixed voltage generator 660 to disconnect the EDGE BUS from $V_{FIXED}$. In the test mode, the test voltage generator 610 is made active to provide $V_{VARIED}$ on line 614. In one embodiment of FIG. 6, the variable voltage $V_{VARIED}$ includes Vcc and ground (ground potential). In other embodiments, however, the variable voltage $V_{VARIED}$ can also include other voltages, which are different from Vcc and ground. As shown in FIG. 6 during the test mode, the variable voltage $V_{VARIED}$ is applied to the EDGE BUS. Thus, during a test mode, the EDGE BUS has a variable voltage of Vcc or ground. Accordingly, dummy digit lines 634 and 636 will also have the variable voltage of Vcc or ground. Thus, in the invention, dummy digit line 634 can have a variable voltage Vcc or ground (or 0) during the test mode. As described previously, and as indicated in FIG. 6, normal digit lines 640, 642 and 643 can be driven to either Vcc or 0 (ground) in both normal and test modes.

Figure 7:
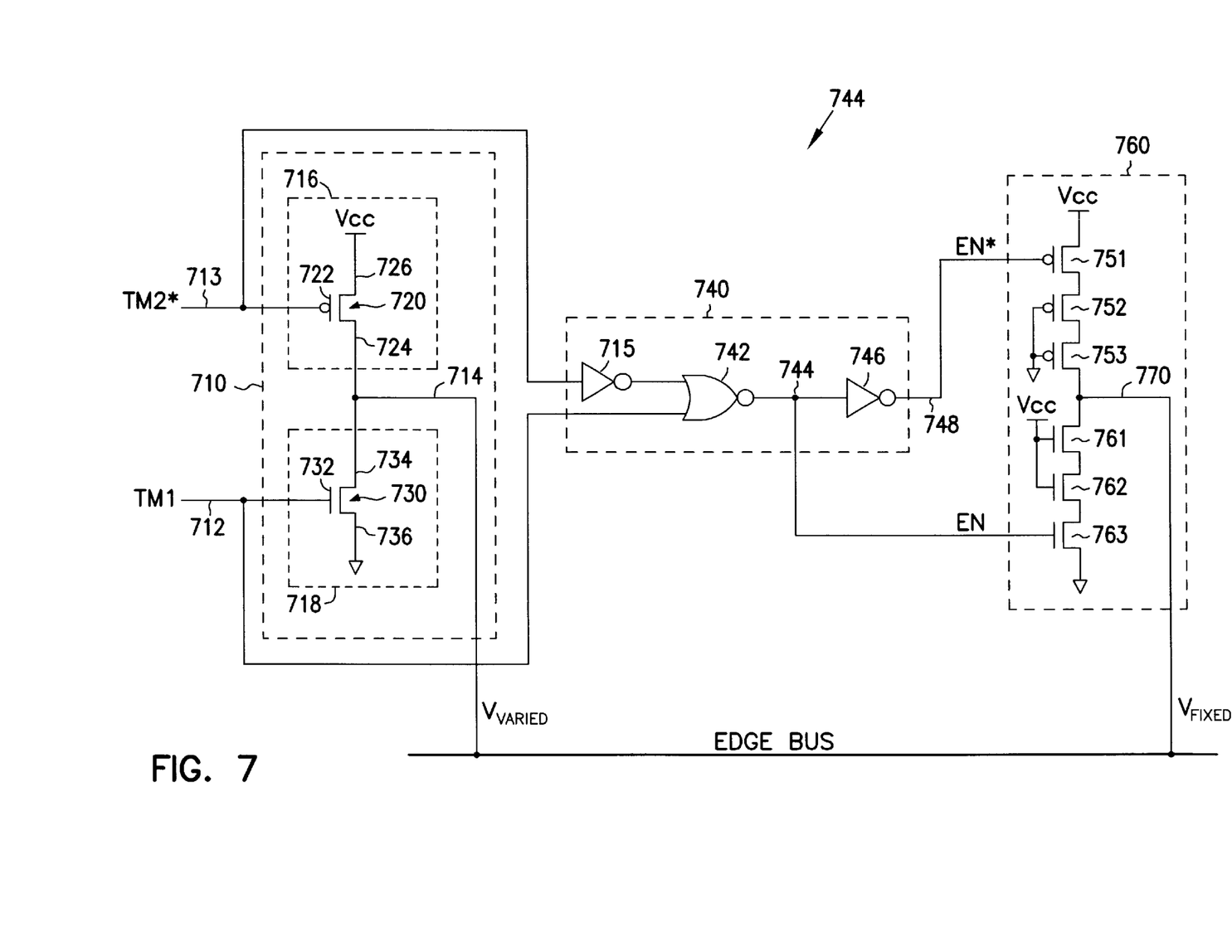
FIG. 7 is a schematic diagram of the voltage controller according to one embodiment of the invention.

FIG. 7 is a schematic diagram of controller 644 of FIG. 6 according to one embodiment of the invention. In the embodiment of FIG. 7, test voltage generator 710 includes a pullup circuit 716 and a pulldown circuit 718. Pulldown circuit 718 includes an input connected to node 712 to receive the first test signal TM1. Pullup circuit 716 includes an input connected to node 713 to receive the second test signal TM2*. Pullup circuit 716 and pulldown circuit 718 connect to a common output at node 714 to provide the variable voltage $V_{VARIED}$. Output 714 connects to the EDGE BUS to provide the $V_{VARIED}$ to the EDGE BUS during a test mode.

Pullup circuit 716 includes a p-channel transistor 720. Transistor 720 has a gate 722 connected to node 713, a source 724 connected to node 714, and a drain 726 connected to Vcc. Pulldown circuit 718 includes an n-channel transistor 730. Transistor 730 has a gate 732 connected to input 712, a source 734 connected to node 714, and a drain 736 connected to ground.

Input nodes 712 and 714 are further connected to and provide inputs to the switching circuit 740. Switching circuit 740 includes a NOR gate 742. NOR gate 742 has a first input connected to node 713 through an inverter 715 to receive the TM2* signal. A second input of NOR gate 742 connects to nodes 712 to receive the TM1 signal. An output of NOR gate 742 connects to node 744 to provide a first enable signal EN. An inverter 746 has an input connected to node 744 and an output connected to node 748, which provides a second enable signal EN*. The first enable signal EN and the second enable signal are connected to the fixed voltage generator 760.

Fixed voltage generator 760 includes a stack of p-channel transistors 751, 752 and 753 and a stack of n-channel transistors 761, 762 and 763. Both stacks of transistors are connected between Vcc and ground and have a common output at node 770. Output 770 connects to the EDGE BUS to provide the fixed voltage $V_{FIXED}$ to the EDGE BUS during a normal mode. The gates of transistors 752 and 753 connect to ground. The gates of transistors 761 and 762 connect to Vcc. The gate of transistor 751 connects to node 748 to receive the EN* signal. The gate of transistor 763 connects to node 744 to receive the EN signal.

In a normal mode of operation of a memory device according to the invention, the TM1 and TM2* signals are not active (not activated). That is, the TM1 signal remains at a low level signal (LOW) and the TM2* signal remains at a high signal level (HIGH). When the TM2* signal is HIGH and the TM1 signal is LOW, both inputs of NOR gate 742 are LOW. This forces a HIGH to the EN signal at node 744, and a LOW to the EN* signal at node 748. The LOW EN* signal turns on transistor 751; the HIGH EN signal turns on transistor 763. When both transistors 751 and 763 are on, node 770 is held to one half of Vcc or Vcc/2. The EDGE BUS is, therefore, also held at Vcc/2 because it connects to node 770. Since the EDGE BUS connects to dummy digit lines 636 (shown in FIG. 6), the dummy digit lines 636 and 634 are also held at Vcc/2 during the normal node. In summary, in a normal mode when the test signals TM1 and TM2* are not active, all dummy digit lines 634 and 636 are always held at Vcc/2.

In a test mode according to the teaching of the present invention, either the TM1 or TM2* signal is active. An active TM1 signal pulls node 714 toward ground which in turn pulls the EDGE BUS to ground. An active TM2* signal pulls node 714 toward VCC which in turn pulls the EDGE BUS to Vcc. Assuming that TM1 is active and TM2* is not active. That is, the TM1 signal is switched from LOW to HIGH and the TM2* signal remains HIGH. Since The TM1 signal at node 712 is HIGH, the input of NOR gate 742 connected to node 712 is also HIGH. This forces the output of NOR gate 742 at node 744 LOW. That means the EN signal at node 744 is LOW and the EN* signal at node 748 is HIGH. A HIGH EN* signal turns off transistor 751; a LOW EN signal turns off transistor 763. When transistors 751 and 763 are off, output 670 is not held at Vcc/2 but floated. This means that the EDGE BUS is disconnected from Vcc/2.

At the same time that the EDGE BUS is being disconnected from Vcc/2, the inactive TM2* (HIGH) signal turns off transistor 720; the active TM1 signal (HIGH) turns on transistor 730. When transistor 720 is off and transistor 730 is on, node 714 is pulled to ground. Since node 714 connects to the EDGE BUS, the EDGE BUS is also pulled to ground. The dummy digit lines 636 are also pull ground because they connect to the EDGE BUS. In summary, in a test mode, when the TM1 signal is active and the TM2* signal is not active, the fixed voltage Vcc/2 connected to dummy digit lines 634 and 463 is replaced by ground.

In the test mode describe above, the TM1 signal is assumed to be active and the TM2* is inactive. Now, it is assumed that TM1 is inactive, e.g. low, and TM2* is active. In this case, when TM2* is active, it is switched from HIGH to LOW. This forces a HIGH the output of inverter 715 which connects to one of the input of NOR gate 742. When the output of inverter 715 inputs a HIGH to one of the inputs of the NOR gate while the other input from node 712 is inactive or LOW, the output at node 744 is forced LOW. Thus the signal EN is LOW and the EN* signal is HIGH. A HIGH EN* signal turns off transistor 751; a LOW EN signal turns off transistor 763. This again disconnects the EDGE BUS from Vcc/2.

At the same time that the EDGE BUS is being disconnected from Vcc/2, the inactive TM1 (LOW) signal turns off transistor 730. The active TM2* (LOW) signal turns on transistor 720. When transistor 730 is off and transistor 720 is on, node 714 is pulled to Vcc. Since node 714 connects to the EDGE BUS, the EDGE BUS is also pulled to Vcc. The dummy digit lines 634 and 636 are also pulled to ground because they connect to the EDGE BUS. In summary, when the TM2* signal is active, the fixed voltage Vcc/2 connected to dummy digit lines 634 and 636 is replaced by Vcc.

As described in the description of FIG. 7, during a normal mode, the TM1 and TM2* signals are not active. Instead, fixed voltage generator 660 is active to provide the fixed voltage Vcc/2 to the EDGE BUS. Because dummy digit lines 634 and 636 connect to the EDGE BUS, they are also held at Vcc/2 during the normal mode. In a test mode, however, fixed voltage generator 660 is disabled. Thus, the EDGE BUS is released from Vcc/2. In the test mode, either the TM1 or TM2* signals is active. If the TM1 signal is active, test voltage generator 710 pulls the EDGE BUS to ground providing $V_{VARIED}$ voltage signal at node 714 to EDGE BUS. Thus, the Vcc/2 voltage on dummy digit lines 634 and 636 are replaced by ground. If the TM2* signal is active, test voltage generator 710 pull the EDGE BUS to Vcc providing $V_{VARIED}$ at node 714 to EDGE BUS. Thus, the voltage on dummy digit lines 634 and 636 is replaced by Vcc.

Figure 8:
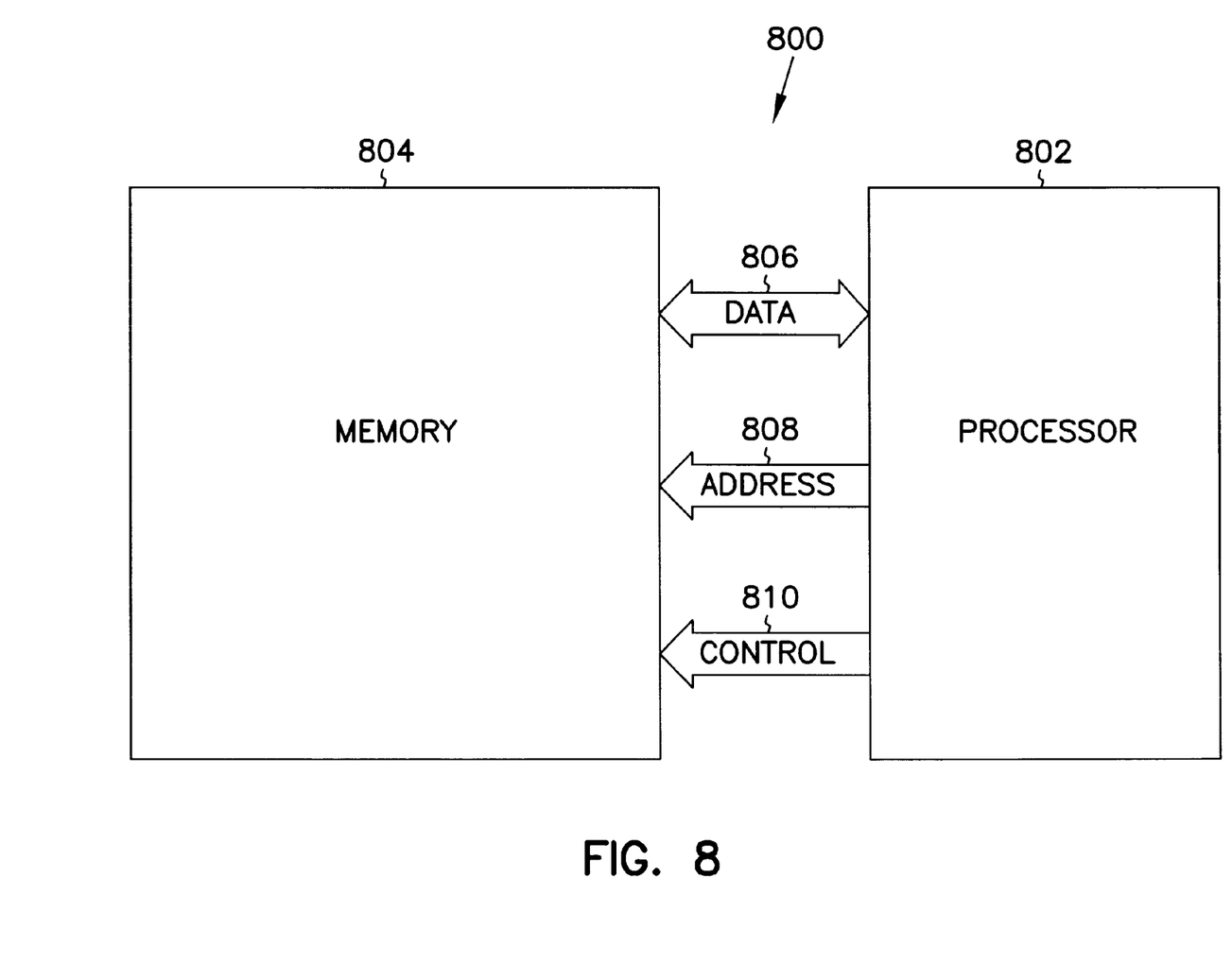
FIG. 8 is a diagram of a processing system according to the invention.

FIG. 8 shows a system 800 according to the invention. System 800 includes processor 802 and memory device 804. Memory device 804 includes a memory device as described in FIGS. 4–7 above according to the teachings of the present invention. Processor 802 can be a microprocessor, digital signal processor, embedded processor, microcontroller, or the like. Processor 802 and memory device 804 communicate using address signals on lines 808, control signals on lines 810, and data signals on lines 806.

According to the invention, memory device 804 includes a plurality of sub-arrays of memory cells, such as sub-arrays described in FIGS. 4–7. During a normal mode of operation of memory device 804, a plurality of dummy digit lines of the edge sub-arrays is applied with a fixed voltage Vcc/2. However, during a test mode, the fixed voltage applied to dummy digit lines is replaced by a variable voltage $V_{VARIED}$ so that all of the sub-arrays can be equally stressed.

Figure 9:
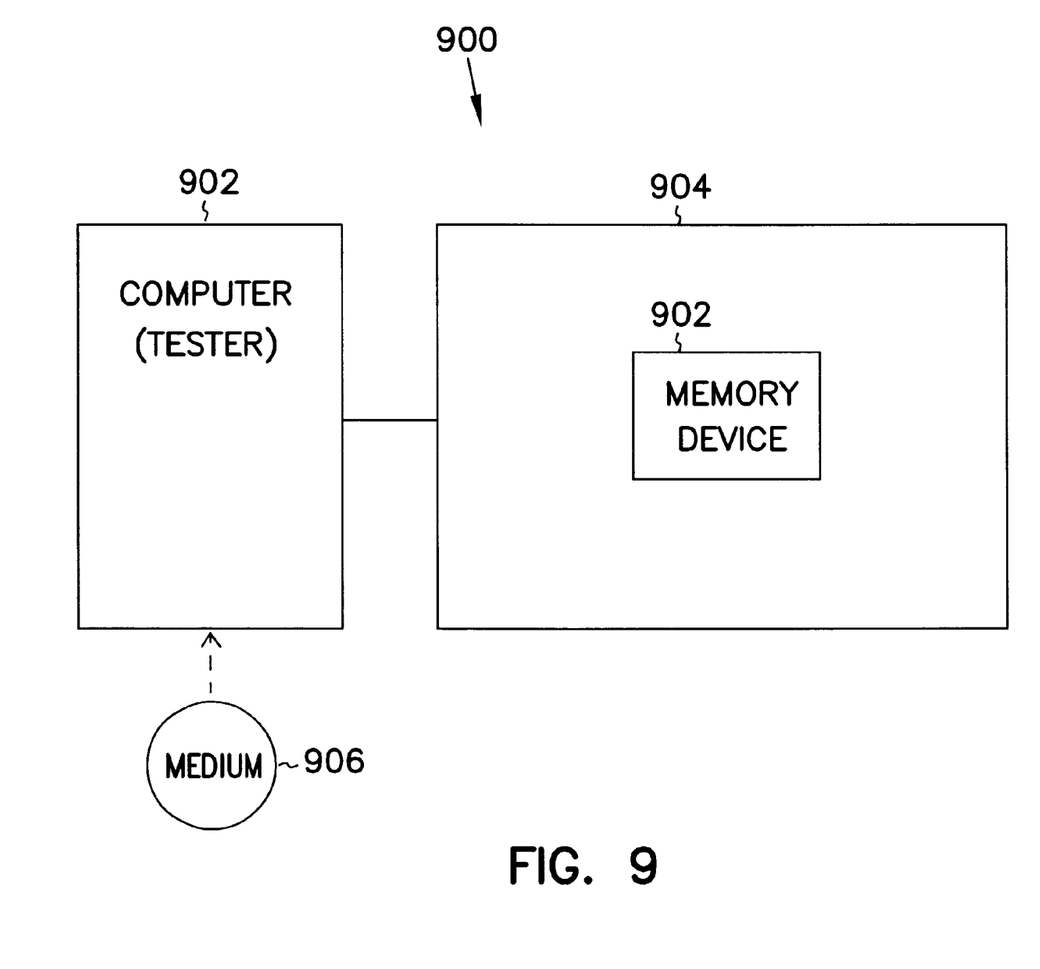
FIG. 9 is a test system according to the invention.

FIG. 9 is a block diagram of a test system according to the invention. Test system 900 includes a tester 902, which can be a computer. Tester 902 connects to a circuit module 904, which includes a memory device 902. Memory device 902 includes a memory device 902 as described according to the invention.

In addition, the test system 900 also includes a machine-readable medium or computer-readable medium 906, which has instructions stored thereon for causing computer 902 to perform a test to memory device 902 such as replacing the Vcc/2 connected to dummy digit lines with either Vcc or ground as described above according to the invention. Computer-readable medium 906 may be a physically fixed medium within computer 902, such as a fixed disk drive, flash memory, programmable read-only memory, random-access memory or other fixed storage medium known in the art. Computer-readable medium 906 further may be removable from computer 902, such as a floppy disk, CD-ROM, tape cartridge, or other removable storage medium known in the art.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A memory device having an open digit line architecture, comprising:
    a plurality of normal memory cells and dummy memory cells, wherein the dummy memory cells are not used by the memory device to store data;
    a plurality of normal digit lines connected to the normal memory cells, wherein each of the normal digit lines is capable of being driven to a supply voltage and to a ground potential;
    a plurality of dummy digit lines connected to the dummy memory cells, wherein the dummy digit lines are connected to a fixed voltage during a normal mode; and
    a voltage controller connected to the plurality of dummy digit lines, wherein the voltage controller replaces the fixed voltage with a variable voltage during a test mode.

2. The memory device of claim 1, wherein the fixed voltage is one-half of the supply voltage.

3. The memory device of claim 1, wherein the variable voltage is greater than the fixed voltage.

4. The memory device of claim 1, wherein the variable voltage is smaller than the fixed voltage.

5. The memory device of claim 1, wherein the normal and dummy memory cells are grouped into sub-arrays, the sub-arrays being arranged in a row, the row running between first and second edges of a memory array of the memory device, wherein the dummy memory cells are located in sub-arrays located at the first and second edges.

6. The memory device of claim 1, wherein the voltage controller includes:
    a fixed voltage generator to generate the fixed voltage;
    a variable voltage generator to generate the variable voltage; and
    a switching circuit connected between the fixed voltage generator and the variable voltage generator in order to disable the fixed voltage generator and to replace the fixed voltage with the variable voltage during the test mode.

7. A memory device having open digit line architecture comprising:
    a plurality of sub-arrays of memory cells including non-edge sub-arrays and edge-sub-arrays, each of the non-edge sub-arrays and edge-sub-arrays including a plurality of digit lines, wherein a portion of digit lines of the edge sub-arrays are dummy digit lines;
    a voltage bus connected to the dummy digit lines; and
    a voltage controller connected to the voltage bus, wherein the voltage controller applies a fixed voltage to the voltage bus and to the dummy digit lines during a normal mode, and wherein the voltage controller applies a variable voltage to the voltage bus and to the dummy digit lines during a test mode.

8. The memory device of claim 7 further comprising a plurality of sense amplifiers wherein a dummy digit line and an adjacent normal digit line connect to different sense amplifiers.

9. The memory device of claim 7, wherein the dummy digit lines and the normal digit lines of the edge sub-array are interleaved.

10. The memory device of claim 7, wherein the variable voltage is a supply voltage of the memory device.

11. The memory device of claim 7, wherein the variable voltage is ground.

12. The memory device of claim 7, wherein the voltage controller includes:
    a pullup circuit connected to the voltage bus, the pullup circuit applying a first voltage to the dummy digit line in response to a first test signal; and
    a pulldown circuit connected to the voltage bus, the pulldown circuit applying a second voltage to the voltage bus in response to a second test signal.

13. A memory device having an open digit line architecture comprising:
    a memory cell connected to a first digit line;
    a sense amplifier connected to the first digit line;
    a second digit line connected to the sense amplifier, the second and first digit lines being connected to a fixed voltage during a normal mode; and
    a voltage controller connected to the second digit line to selectively replace the fixed voltage with a variable voltage during a test mode.

14. The memory device of claim 13, wherein the fixed voltage is one-half of a supply voltage of the memory device.

15. The memory device of claim 13, wherein the variable voltage is a supply voltage of the memory device.

16. The memory device of claim 13, wherein the variable voltage is ground.

17. The memory device of claim 13, wherein the voltage controller includes a test voltage generator connected to the second digit line, the test voltage generator generating a first voltage in response to a first test signal and generating a second voltage in response to a second test signal.

18. A memory device having an open digit line architecture comprising:
    a memory cell connected to a first digit line;
    a sense amplifier connected to the first digit line;
    a second digit line connected to the sense amplifier, the second and first digit lines being connected to a first voltage during a normal mode; and
    a voltage controller connected to the second digit line to selectively replace the first voltage with a second and a third voltage during a test mode, wherein the first, second and third voltages are not the same.

19. The memory device of claim 18, wherein the second voltage is greater than the first voltage.

20. The memory device of claim 18, wherein the third voltage is smaller than the first voltage.

21. The memory device of claim 18, wherein the first digit line connects to unused memory cells of the memory device.

22. The memory device of claim 18, wherein the voltage controller includes:

a pullup circuit connected to the second digit line to apply the second voltage to the second digit line in response to one test signal; and a pulldown circuit connected to the second digit line to apply the third voltage to the second digit line in response to another test signal.

23. The memory device of claim 22 further comprising:

a fixed voltage generator connected to the second digit line, the fixed voltage generator generating the fixed voltage;

a switching circuit connected to the fixed voltage generator, the switching circuit enabling the fixed voltage generator during the normal mode and disabling the fixed voltage generator during the test mode.

24. A memory device having open an digit line architecture comprising:

a memory cell connected to a first digit line;

a sense amplifier connected to the first digit line;

a second digit line connected to the sense amplifier, the second and first digit lines being connected to a fixed voltage during a normal mode; and a voltage controller connected to the second digit line to selectively replace the fixed voltage with a supply voltage of the memory device during a test mode.

25. A memory device having an open digit line architecture comprising:

a memory cell connected to a first digit line;

a sense amplifier connected to the first digit line;

a second digit line connected to the sense amplifier, the second and first digit lines being connected to a fixed voltage during a normal mode; and a voltage controller connected to the second digit line to selectively replace the fixed voltage with ground during a test mode.

26. A memory device having an open digit line architecture comprising:

a sub-array having a plurality of dummy digit lines;

a plurality of sense amplifiers connected to the dummy digit lines, the dummy digit lines being connected to a fixed voltage during a normal mode; and a voltage controller connected to the dummy digit lines to replace the fixed voltage with a variable voltage during a test mode.

27. A memory device having an open digit line architecture comprising:

a sub-array having a plurality of dummy digit lines;

a plurality of sense amplifiers connected to the dummy digit lines, the dummy digit lines being connected to a first voltage during a normal mode; and a voltage controller connected to the dummy digit lines to replace the first voltage with a second and a third voltage during a first and a second test mode respectively, wherein the first, second and third voltages are not the same.

28. A memory device having an open digit line architecture comprising:

a memory array including a plurality of sub-arrays of memory cells, the sub-arrays being arranged in a row, the row running between a first edge and a second edge of the memory array, the memory cells being connected to a plurality of digit lines;

a sense amplifier connected to a digit line of the sub-array located next to the first edge, wherein sense amplifier connects the digit line to a fixed voltage during a normal mode; and a voltage controller connected to the sense amplifier and the digit line to replace the fixed voltage with a variable voltage during a test mode.

29. A memory device having an open digit line architecture comprising:

a memory array including a plurality of sub-arrays of memory cells, the sub-arrays being arranged in a row, the row running between a first edge and a second edge of the memory array, the memory cells being connected to a plurality of digit lines;

a sense amplifier connected to a digit line of the sub-array located next to the first edge, wherein the digit line connects to a first voltage during a normal mode; and a voltage controller connected to the digit line to selectively replace the fixed voltage with a second voltage and a third voltage during a first and a second test mode respectively, wherein the first, second and third voltages are not the same.

30. A system comprising:

a processor; and a memory device connected to the processor, the memory device including:

a plurality of normal memory cells and dummy memory cells, wherein the dummy memory cells are not used by the memory device to store data;

a plurality of normal digit lines connected to the normal memory cells, wherein each of the normal digit lines is capable of being driven to a supply voltage and to a ground potential;

a plurality of dummy digit lines connected to the dummy memory cells, wherein the dummy digit lines are connected to a fixed voltage during a normal mode; and a voltage controller connected to the plurality of dummy digit lines, wherein the voltage controller replaces the fixed voltage with a variable voltage during a test mode.

31. The system of claim 30, wherein the normal and dummy memory cells are grouped into sub-arrays, the sub-arrays being arranged in a row, the row running between first and second edges of a memory array of the memory device, wherein the dummy memory cells are located in sub-arrays located at the first and second edges.

32. The system of claim 30, wherein the voltage controller includes:

a fixed voltage generator to generate the fixed voltage;

a variable voltage generator to generate the variable voltage; and a switching circuit connected between the fixed voltage generator and the variable voltage generator in order to disable the fixed voltage generator and to replace the fixed voltage with the variable voltage during the test mode.

33. A system comprising a processor; and a memory device connected to the processor, the memory device including:

a plurality of sub-arrays of memory cells including non-edge sub-arrays and edge-sub-arrays, each of the non-edge sub-arrays and edge-sub-arrays including a plurality of digit lines, wherein a portion of digit lines of the edge sub-arrays are dummy digit lines;

a voltage bus connected to the dummy digit lines, wherein the voltage controller provides a fixed voltage the voltage bus and to the dummy digit lines during a normal mode; and a voltage controller connected to the voltage bus, and wherein the voltage controller applies a variable voltage to the voltage bus and to the dummy digit lines during a test mode.

34. The system of claim 33 further comprising a plurality of sense amplifier, wherein a dummy digit line and an adjacent normal digit line connect to different sense amplifiers.

35. The system of claim 33, wherein the dummy digit lines and the normal digit lines of the edge sub-array are interleaved.

36. A system comprising:

a processor; and a memory device connected to the processor, the memory device including:

a memory cell connected to a first digit line;

a sense amplifier connected to the first digit line;

a second digit line connected to the sense amplifier, the second and first digit lines being connected to a fixed voltage during a normal mode; and a voltage controller connected to the second digit line to selectively replace the fixed voltage with a variable voltage during a test mode.

37. The system of claim 36, wherein the fixed voltage is one-half of a supply voltage of the memory device.

38. The system of claim 36, wherein the variable voltage is a supply voltage of the memory device.

39. The system of claim 36, wherein the variable voltage is ground.

40. A method of testing a memory device having an open digit line architecture, the method comprising activating a test mode signal during a test mode;

disconnecting a fixed voltage connected to a voltage bus in response to the test mode signal, the voltage bus being connected to a plurality of dummy digit lines of a sub-array of memory cells, the sub-array being located at an edge of a memory array of the memory device; and applying a variable voltage to the voltage bus during the test mode.

41. The method of claim 40, wherein applying a variable voltage includes applying a variable voltage that is greater than the fixed voltage.

42. The method of claim 40, wherein applying a variable voltage includes applying a variable voltage that is smaller than the fixed voltage.

43. The method of claim 40, wherein applying a variable voltage includes applying a supply voltage of the memory device to the voltage bus.

44. The method of claim 40, wherein applying a variable voltage includes applying a ground to the voltage bus.

45. A method of testing a memory device having an open digit line architecture, the method comprising:

activating a test mode signal during a test;

disconnecting a fixed voltage in response to the test signal, wherein the fixed voltage is applied to a dummy digit line of an edge sub-array of the memory device when the device is in normal mode; and applying a variable voltage to the dummy digit line during the test.

46. The method of claim 45, wherein applying a variable voltage includes applying a supply voltage of the memory device to the dummy digit line.

47. The method of claim 45, wherein applying a variable voltage includes applying a ground to the dummy digit line.

48. A method of testing a memory device having open digit line architecture, the method comprising:

activating a test mode signal during a test;

disconnecting a first voltage, that is normally applied to a dummy digit line of an edge sub-array of the memory device, in response to activating the test mode signal; and applying a second voltage to the dummy digit line during the test, wherein the second voltage and first voltage are not the same.

49. The method of claim 48, wherein applying a second voltage includes applying a voltage that is greater than the first voltage.

50. The method of claim 48, wherein applying a second voltage includes applying a voltage that is smaller than the first voltage.

51. A method of testing a memory device having an open digit line architecture, the method comprising:

activating a test mode signal during a test;

disconnecting a fixed voltage, that is normally connected to a dummy digit line of an edge sub-array of the memory device, in response to activating the test mode signal; and applying a supply voltage of the memory device to the dummy digit line during the test.

52. A method of testing a memory device having an open digit line architecture, the method comprising:

activating a test mode signal during a test;

disconnecting a fixed voltage, that is normally a dummy digit line of an edge sub-array of the memory device, in response to activating the test mode signal; and applying a ground the dummy digit line during the test.

53. A machine-readable medium having instructions stored thereon capable of causing a tester to perform method of testing, the method comprising:

activating a test mode signal during a test;

disconnecting a fixed voltage connected to a voltage bus in response to activating the test mode signal, the voltage bus being connected to a plurality of dummy digit lines of a sub-arrays of memory cells, the sub-array being located at an edge of a memory array of the memory device; and applying a variable voltage to the voltage bus during the test.

54. A machine-readable medium having instructions stored thereon capable of causing a tester to perform method of testing, the method comprising:

activating a test mode signal during a test;

disconnecting a fixed voltage in response to the test mode signal, wherein the fixed voltage is applied to a dummy digit line of an edge sub-array of the memory device when the device is in normal mode; and applying a variable voltage to the dummy digit line during the test.

* * * * *

UNITED STATES PATENT AND TRADEMARK OFFICE
CERTIFICATE OF CORRECTION

PATENT NO. : 6,535,439 B2
DATED : March 18, 2003
INVENTOR(S) : Timothy B. Cowles It is certified that error appears in the above-identified patent and that said Letters Patent is hereby corrected as shown below:

Column 3,
Line 47, delete "world" and insert -- word -- therefor.

Column 5,
Line 43, delete "." after "architecture".

Column 9,
Line 55, delete "The" and insert -- the -- therefor.

Column 13,
Line 25, delete "open an" and insert -- an open -- therefor.

Column 15,
Line 9, insert -- to -- before "the voltage".

Signed and Sealed this

Fifth Day of August, 2003

JAMES E. ROGAN
*Director of the United States Patent and Trademark Office*